Figure 1:
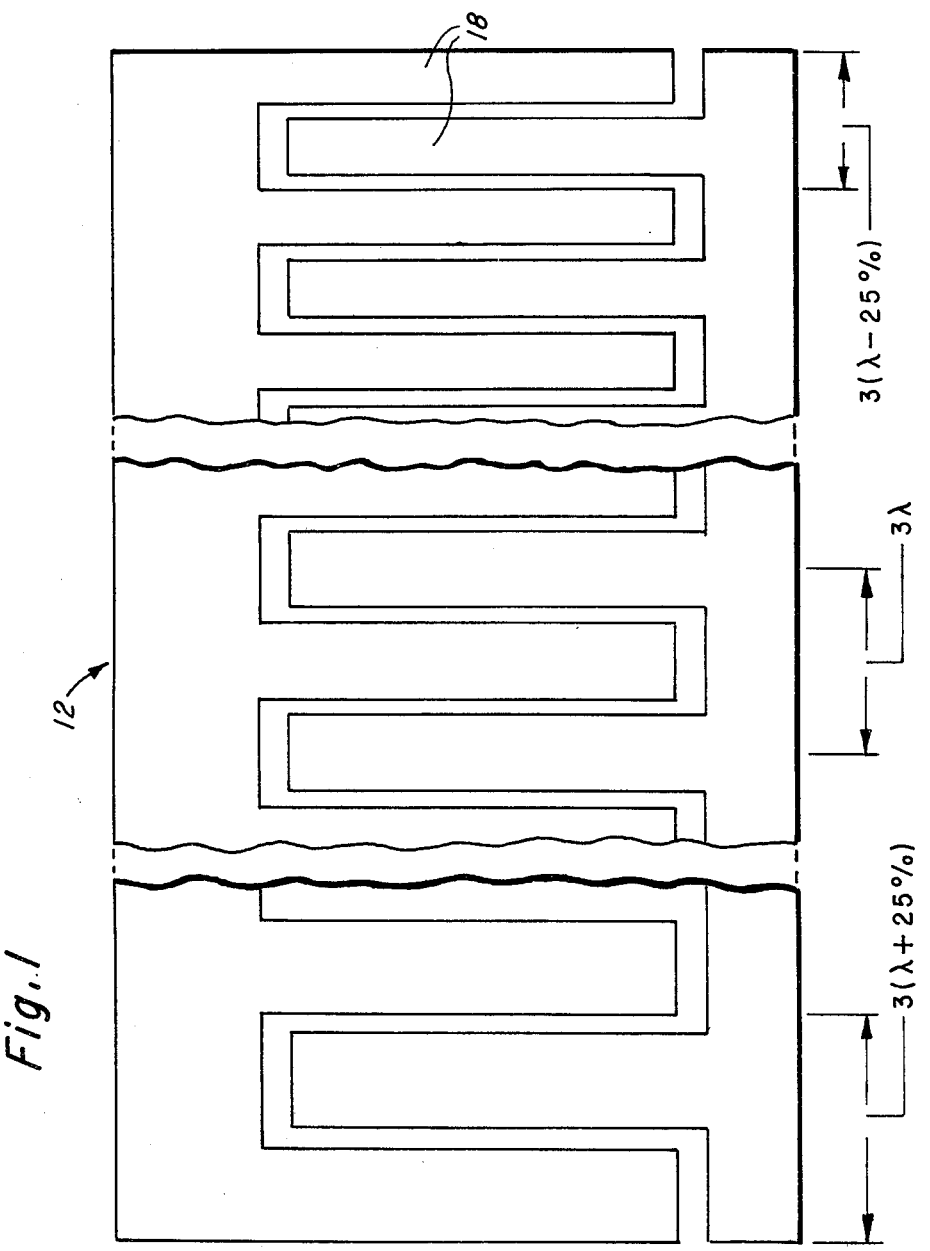
Figure 1:
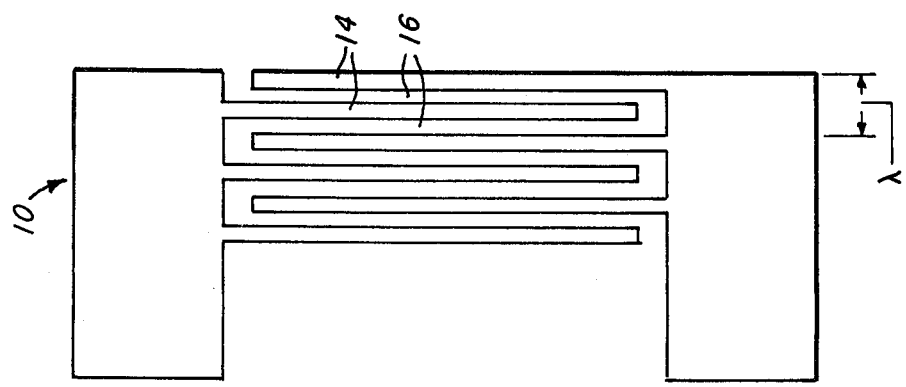

United States Patent [19]
Mellon et al.

[11] 3,936,774
[45] Feb. 3, 1976

[54] HIGH BULK MODE REJECTION SURFACE WAVE DEVICE

[75] Inventors: Donald Williams Mellon, Plano; Richard Alan Kempf, McKinney, both of Tex.

[73] Assignee: Texas Instruments Incorporated, Dallas, Tex.

[22] Filed: Mar. 14, 1974

[21] Appl. No.: 450,966

[52] U.S. Cl............... 333/30 R; 310/9.8; 333/72
[51] Int. Cl.².. H03H 9/02; H03H 9/26; H03H 9/30; H04R 17/10
[58] Field of Search............ 333/30 R, 72; 29/25.35; 310/8; 8.1; 9.7; 9.8

[56] References Cited
UNITED STATES PATENTS
3,614,463  10/1971  Slobodnik, Jr............... 333/30 R X
3,742,396  6/1973   Bahr et al. ..................... 333/30 R OTHER PUBLICATIONS
Kuhn – "Enhanced Harmonic Response of an Interdigital Surface Acoustic Wave Transducer," in IEEE Tran. Electron Devices, Vol. ED-18 No. 6, June 1971; p. 395.

Engan – "Excitation of Elastic Surface Waves by Spatial Harmonics of Interdigital Transducers," in IEEE Trans. on Electron Devices, Vol. ED 16, No. 12, Dec. 1969; pp. 1014–1017.

*Primary Examiner*—Archie R. Borchelt
*Assistant Examiner*—Marvin Nussbaum
*Attorney, Agent, or Firm*—Harold Levine; Rene' E. Grossman; Alva H. Bandy

[57] ABSTRACT

Disclosed is a surface wave device comprising one transducer having its fundamental resonant frequency at a subharmonic of the device operating frequency and a second transducer having its fundamental resonant frequency at the device operating frequency. Both transducers respond to surface waves at the operating frequency. Only the harmonic operated transducer responds to bulk waves at the operating frequency. Thus, signal coupled from one transducer to the other at the operating frequency contains no noise generated by bulk mode coupling.

6 Claims, 3 Drawing Figures

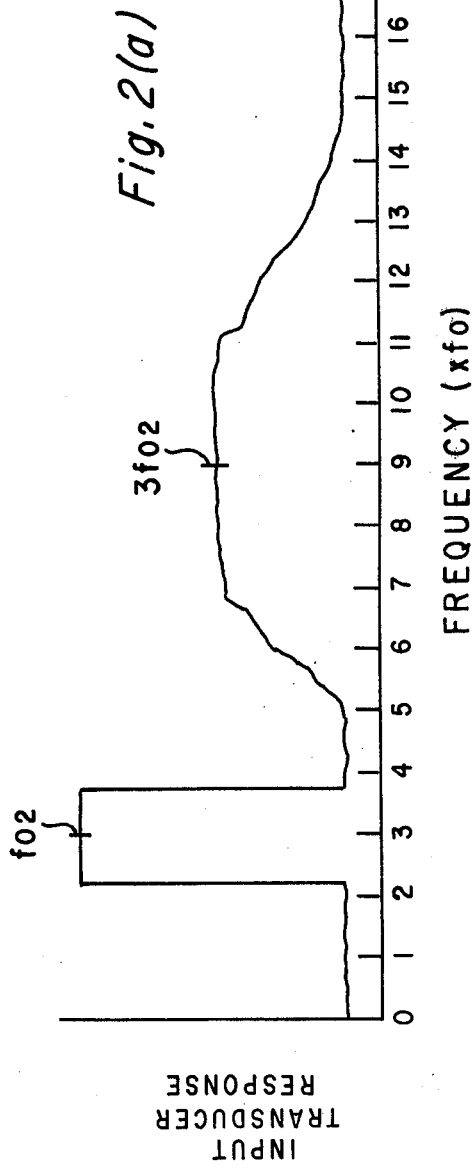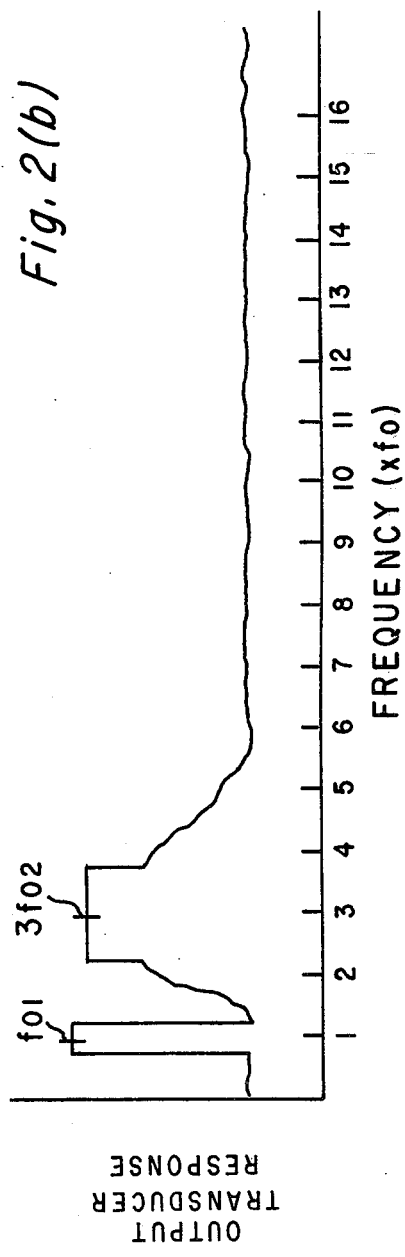

HIGH BULK MODE REJECTION SURFACE WAVE DEVICE

The invention relates to surface wave devices and more particularly to devices having high bulk mode rejection.

Surface wave devices have been found useful in a wide variety of signal processing areas and the basic technology is well known in the art.

A basic surface wave transducer comprises a pair of metal electrodes deposited on the surface of a piezoelectric substrate. When an electrical potential is applied between the electrodes an electrical field is generated in the substrate material causing a dimensional change in the substrate. If alternating potential is applied between the electrodes acoustic waves are generated which will propagate along the surface or through the bulk of the substrate.

Waves traveling on the surface of the substrate travel in a well defined path and may be detected at any point along the path. Waves traveling through the bulk of the substrate follow a variety of paths and may be detected only at the points where they impinge on substrate surfaces. Any bulk wave signal will be composed of several components having different time delays due to the various path lengths followed. In most surface wave devices great care is taken to see that no signal is coupled from the input transducer to the output transducer except by means of surface waves for this reason.

A transducer most efficiently generates acoustic waves in the substrate material at its fundamental resonant frequency at which electrode spacing equals one-half wavelength. The wavelength is equal to the velocity of propagation divided by the frequency. For a given frequency the wavelength of surface waves and bulk waves are different because their velocities are different. Thus a transducer which will efficiently generate surface waves on the substrate will not effectively generate bulk waves at its fundamental resonant frequency.

Since wavelength is inversely proportional to frequency the electrode spacing decreases as the frequency of operation increases. An operating frequency limit is reached when the wavelength approaches the minimum line width and spacing which present technology allows to be fabricated.

Surface wave device performance is degraded by the mere presence of metal electrodes on the substrate surface. The electrodes produce a loading effect on the surface changing the surface wave velocity under the electrode and absorbing part of the surface wave energy. The velocity change causes reflections of signals and the energy loss distorts the signals. Both of these effects increase in direct proportion to the number of electrodes on the surface. For many devices such as broadband filters the number of electrodes is small and the loading and distortion effects are minimal; but, for more complex devices such as chirp compression filters which may require the use of thousands of electrodes, these effects can seriously degrade performance.

It is known in the art that a surface wave transducer will respond to signals at the odd harmonics of its fundamental resonant frequency. This response is termed harmonic resonance. The term "respond" includes generating acoustic waves when driven by electrical signals as well as generating electrical signals when driven by acoustic waves, the transducer action being reciprocal. Proper choice of electrode width can produce good coupling efficiency at the third harmonic. These facts have made it possible to reduce the frequency and distortion problems described above by operating surface wave devices at a harmonic resonant frequency. Thus, for example, a device to be operated at three megahertz may have a fundamental resonant frequency of one megahertz. The one megahertz fundamental resonant frequency device would use only one-third as many electrodes as a device having a 3 megahertz fundamental resonant frequency and each electrode and space would be three times as wide.

The bulk mode waves described above interfere with the harmonic operation of surface wave devices. Any surface wave transducer will generate bulk mode waves at frequencies above the transducer fundamental resonant frequency where the electrode pattern is designed to generate surface waves. In the above example, the transducer pattern fundamentally resonant at 1 MHz will generate bulk mode acoustic waves near 3 MHz as well as the third harmonic surface waves. Thus in harmonic operated surface wave devices, the signal will be coupled from input to output by means of bulk mode waves as well as by means of the desired surface waves.

Many methods of suppressing the unwanted bulk mode signals have been developed in efforts to gain full benefit of harmonic operation. Grooves have been cut across the bottom of the substrate to break the bulk mode wave propagation path. Energy absorbing material has been applied to the bottom surface of the substrate to attenuate the bulk mode waves which reflect off the bottom surface in traveling from input to output transducer. Various transducer designs have been developed which cause the bulk mode signal to arrive at the output transducer in two out of phase components of equal magnitude such that cancellation occurs. These methods of rejecting the bulk mode signals are not effective, add processing steps, and increase complexity, thereby offsetting some of the advantage gained by the harmonic operation.

Accordingly, it is an object of the present invention to provide a surface wave device which operates at a harmonic of a transducer fundamental resonant frequency while rejecting bulk mode signals.

It is also an object of the present invention to provide a surface wave device which employs only standard processes and transducer designs.

Briefly stated the surface wave device of the present invention comprises, for example, an input transducer having a fundamental resonant frequency equal to the device operating frequency, for example 3 MHz, and an output transducer having a fundamental resonant frequency which is an odd subharmonic, for example 1 MHz, of the device operating frequency. Both transducers respond to surface waves at the operating frequency and signals may thus be coupled from one transducer to the other at the operating frequency by surface waves. The input transducer responds to bulk mode waves only above the device operating frequency. Thus signals may not be coupled from one transducer to the other by bulk mode waves at the device operating frequency.

Other objects and features of the present invention will become better understood by reference to the following detailed description when read in conjunction with the accompanying drawings wherein:

FIG. 1 is a pictorial view of two transducers forming one embodiment of the present invention; and FIGS. 2a and 2b are graphical representations of the responses of the transducers of FIG. 1, plotted versus frequency.

With reference to the drawing, FIG. 1 shows typical electrode patterns of a chirp filter used in radar systems. Transducer 10 is used for an input and is broadband, having only a small number of identical electrodes which are fundamentally resonant at the center frequency of the operating frequency band. The frequency response of transducer 10 is shown in FIG. 2a, and is a typical response for a transducer with a fundamental resonant frequency, $f_{o2}$, of $3f_0$ and 50% frictional bandwidth.

The response, FIG. 2a, of input transducer 10 includes a fundamental frequency, $f_{o2}$, response extending from $2.25 f_0$ to $3.75 f_0$ which corresponds to the 50% frictional bandwidth. Above this bandpass range is a less well defined band of response caused by the bulk mode waves and the harmonic responses. The third harmonic, $3f_{o2}$, response is seen as a small step increase in the bulk mode response extending from $8.25f_0$ to $9.75f_0$. By proper electrode width choice the third harmonic portion of the response can be made very small with respect to the fundamental resonant frequency $3f_0$, response. The electrode 14 width (FIG. 1) chosen for the preferred embodiment is one-fourth of the wavelength. Since the electrodes 14 are spaced on half-wavelength centers, the space 16 between adjacent electrodes is also one-fourth of the wavelength.

The output transducer 12 shown in FIG. 1 is much more complex than the simple broadband input transducer. The output transducer must perform the functions of responding to the entire operating frequency band, $2.25f_0$ to $3.75f_0$, and of providing a time delay continuously varying with the frequency. To cover the entire frequency band, the output transducer electrode widths and spacings are varied continuously along the length of the transducer. The transducer 12 has a fundamental resonant frequency of $0.75f_0$ at one end and $1.25f_0$ at the other. Electrode 18 widths of four-tenths of the subharmonic wavelength are used to enhance third harmonic resonance. Any small section of transducer 12 has a large number of substantially identical electrodes and acts as a narrow band filter responding to only a small part of the filter passband.

The response of output transducer 12 is illustrated in FIG. 2b. The fundamental frequency, $f_{o1}$, response occurs at $f_0$ with a 50% fractional bandwidth. The bulk mode wave response occurs at higher frequencies with a relatively large and well-defined third harmonic $3f_{o1}$ response centered at $3f_0$ with a 50% fractional bandwidth. Since this transducer is optimized for third harmonic response, its response at $3f_0$ is nearly as large as the response at $f_0$.

FIGS. 2a and 2b demonstrate why this invention eliminates bulk mode signals from the device output. To couple a signal from one of these transducers 10 or 12 to the other at a given frequency, both transducers must respond to that frequency. Near the device operating frequency, $3f_0$, only output transducer 12 responds to bulk mode waves, although both respond to surface waves. Thus signals will be coupled from input to output by surface waves, without any substantial coupling by bulk mode waves, at the device operating frequency. The input transducer responds to bulk mode waves at a frequency well above the operating frequency and at which the output transducer has essentially no response.

Although the input transducer is fundamentally resonant at the operating frequency, $3f_0$, this invention allows a substantial increase in device operating frequency with substantially no bulk mode noise. If the desired operating frequency is near the limit imposed by available fabrication techniques, the broadband input transducer essentially extends the frequency of operation by half the bandwidth since frequencies greater than the pattern design frequency are generated by such a transducer. The fabrication limit is also greater for simple transducers such as input 10 due to the reduced chance of defect.

The output transducer 12 (FIG. 1) operates as a series of narrow band filters which together respond to the whole frequency band of interest, but with various delay times depending on frequency. Thus, if this transducer were designed to have fundamental resonance over the entire operating frequency band of the input transducers and the operating band center frequency was at the technical limit, then half of the output transducer would be above the technical limit. It would also have a large number of electrodes generating distortion. Harmonic operation of the output transducer reduces the complexity by eliminating two-thirds of the electrodes and increasing the electrode pattern dimensions. The smaller number of electrodes also makes it more practical to fabricate smaller geometries by reducing the chance of defect.

The input transducer operating at its fundamental resonant frequency allows a significant reduction in device impedance resulting in reduced matching network complexity and lower insertion loss than could be achieved using a harmonic operated input transducer.

Although the present invention has been shown and illustrated in terms of the specific apparatus, it will be apparent that changes or modifications can be made without departing from the spirit and scope of the invention as defined by the appended claims.

What is claimed is:

1. A surface wave device having substantially no bulk mode signal output comprising:
   a. a substrate for conveying acoustic waves;
   b. a first transducer having a plurality of electrodes in operative association with the substrate for generating acoustic surface waves, each of said plurality of electrodes having a preselected spacing as to an adjacent electrode at one-half wavelength at a desired operating frequency to reduce substantially the response of the first transducer to bulk waves at the operating frequency; and
   c. a second transducer having a plurality of electrodes in operative association with the substrate for receiving the first transducer output, each of said plurality of electrodes having preselected spacings from an adjacent electrode at one-half wavelength of a preselected subharmonic of said operating frequency.

2. A surface wave device according to claim 1 wherein said first surface wave transducer is an input surface wave transducer and said second surface wave transducer is an output surface wave transducer.

3. A surface wave device according to claim 2 wherein said input surface wave transducer comprises electrodes having widths of one quarter of the surface wavelength at the operating frequency.

4. A surface wave device according to claim 2 wherein said output surface wave transducer has a fundamental resonant frequency of one-third the preselected operating frequency.

5. A surface wave device according to claim 4 wherein said output surface wave transducer comprises electrodes having widths of four-tenths of the surface wavelengths at one-third the operating frequency, whereby third harmonic response is enhanced.

6. A method for fabricating surface wave devices for substantially rejecting bulk mode signals comprising:
 a. forming electrodes with preselected spacings for an input surface wave transducer on a piezoelectric substrate for substantially reducing the response including bulk wave signal response of the transducer to a desired harmonic as to a fundamental resonant frequency; and
 b. forming electrodes with preselected spacings for an output transducer for covering a subharmonic of said fundamental resonant frequency; whereby said transducers cooperate during operation to reject bulk wave signals at the desired harmonic and fundamental resonant frequency.

* * * * *